United States Patent
Wu et al.

(10) Patent No.: US 7,180,096 B2
(45) Date of Patent: *Feb. 20, 2007

(54) GALLIUM-NITRIDE BASED LIGHT-EMITTING DIODE STRUCTURE WITH HIGH REVERSE WITHSTANDING VOLTAGE AND ANTI-ESD CAPABILITY

(75) Inventors: Liang-Wen Wu, Banciao (TW); Ru-Chin Tu, Tainan (TW); Cheng-Tsang Yu, Wufong Township, Taichung County (TW); Tzu-Chi Wen, Tainan (TW); Fen-Ren Chien, Yonghe (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 241 days.

This patent is subject to a terminal disclaimer.

(21) Appl. No.: 10/964,350

(22) Filed: Oct. 12, 2004

(65) Prior Publication Data

US 2006/0049424 A1    Mar. 9, 2006

(30) Foreign Application Priority Data

Sep. 3, 2004    (TW) .............................. 93126690 A

(51) Int. Cl.
*H01L 27/15* (2006.01)
*H01L 31/12* (2006.01)

(52) U.S. Cl. ........................... 257/79; 257/85; 257/194

(58) Field of Classification Search ................ 257/79, 257/85, 97, 189, 194

See application file for complete search history.

(56) References Cited

U.S. PATENT DOCUMENTS

2005/0263779 A1* 12/2005 Hon et al. .................... 257/94
2006/0076574 A1*  4/2006 Wu et al. ................... 257/103

* cited by examiner

*Primary Examiner*—Theresa T. Doan

(57) ABSTRACT

An epitaxial structure for GaN-based LEDs to achieve better reverse withstanding voltage and anti-ESD capability is provided. The epitaxial structure has an additional anti-ESD thin layer on top of the p-type contact layer within traditional GaN-based LEDs, which is made of undoped indium-gallium-nitrides (InGaN) or low-band-gap (Eg<3.4 eV), undoped aluminum-indium-gallium-nitrides (AlInGaN). This anti-ESD thin layer greatly improves the GaN-based LEDs' reverse withstanding voltage and resistivity to ESD, which in turn extends the GaN-based LEDs' operation life significantly.

4 Claims, 5 Drawing Sheets

GALLIUM-NITRIDE BASED LIGHT-EMITTING DIODE STRUCTURE WITH HIGH REVERSE WITHSTANDING VOLTAGE AND ANTI-ESD CAPABILITY

BACKGROUND OF THE INVENTION

1. Field of the Invention

The present invention generally relates to the gallium-nitride based light-emitting diodes and, more particularly, to an epitaxial structure of the gallium-nitride based light-emitting diodes having a high reverse withstanding voltage and a high resistivity to electrostatic discharge.

2. The Prior Arts

Gallium-nitride (GaN) based light-emitting diodes (LEDs), as various color LEDs can be developed by controlling the GaN-based material's composition, has been the research and development focus in the academic arena and in the industries as well in recent years. Besides being applied in the display of consumer electronic appliances such as digital clocks and cellular handsets, technology breakthroughs in terms of luminance and lighting efficiency has led GaN-based LEDs into applications such as outdoor display panels and automobile lamps.

To have practical applicability in these outdoor display devices, besides having high luminance and lighting efficiency, GaN-based LEDs must have a rather high reverse withstanding voltage and high resistivity to electrostatic discharge (ESD), so that they can continue to operate for an extended period of time under the harsh, outdoor environment.

However, for conventional GaN-based LEDs, they have a traditional epitaxial structure by growing GaN-based nitrides on a sapphire substrate. GaN-based nitrides and the sapphire substrate usually have mismatched lattice constants, causing an excessive accumulation of stresses and, thereby, causing the GaN-based LEDs to have an inferior epitaxial quality. The GaN-based LEDs' anti-ESD capability and reverse withstanding voltage are therefore deteriorated.

The most widely adopted solution in recent years is to use a flip-chip process to combine a GaN-based LED with a Zener diode made of silicon. Although this solution indeed effectively improves the GaN-based LED's anti-ESD capability, the flip-chip process is much more complicated than the traditional manufacturing process for general GaN-based LEDs.

Accordingly, the present invention is directed to overcome the foregoing disadvantages of conventional GaN-based LEDs of the prior arts.

SUMMARY OF THE INVENTION

The present invention provides an epitaxial structure for the GaN-based LEDs so that the limitations and disadvantages from the prior arts can be obviated practically.

The most significant difference between the GaN-based LEDs according to the present invention and according to the prior arts lies in the formation of an anti-ESD thin layer made of undoped indium-gallium-nitrides (InGaN) or low-band-gap (Eg<3.4 eV), undoped aluminum-indium-gallium-nitrides (AlInGaN) on top of the p-type contact layer of traditional GaN-based LEDs. This anti-ESD thin layer greatly improves the GaN-based LEDs' reverse withstanding voltage and resistivity to ESD, which in turn extends the GaN-based LEDs' operation life significantly.

FIGS. 1(a) and 1(b) of the attached drawings illustrate the maximum ESD voltage and the reverse withstanding voltage of a GaN-based LED according the present invention versus the thickness of the GaN-based LED's anti-ESD thin layer. As shown in FIGS. 1(a) and 1(b), an anti-ESD thin layer made of undoped $In_{0.2}Ga_{0.8}N$ obviously provides much higher reverse withstanding voltage and maximum ESD voltage than anti-ESD thin layers made of Si-doped and Mg-doped $In_{0.2}Ga_{0.8}N$, when all three anti-ESD layers are of a same thickness between 5 Å and 100 Å.

Besides the foregoing advantages, due to the low band gap characteristics of undoped InGaN and undoped AlInGaN, an anti-ESD thin layer made of such material, in comparison to the p-type contact layer in a GaN-based LED of the prior art, has a lower resistivity (and, thereby, is easier to form ohmic contact) between the anti-ESD thin layer and the metallic electrode or transparent conductive electrode above.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

In the following, detailed description along with the accompanied drawings is given to better explain preferred embodiments of the present invention. Please be noted that, in the accompanied drawings, some parts are not drawn to scale or are somewhat exaggerated, so that people skilled in the art can better understand the principles of the present invention.

Figure 1A:
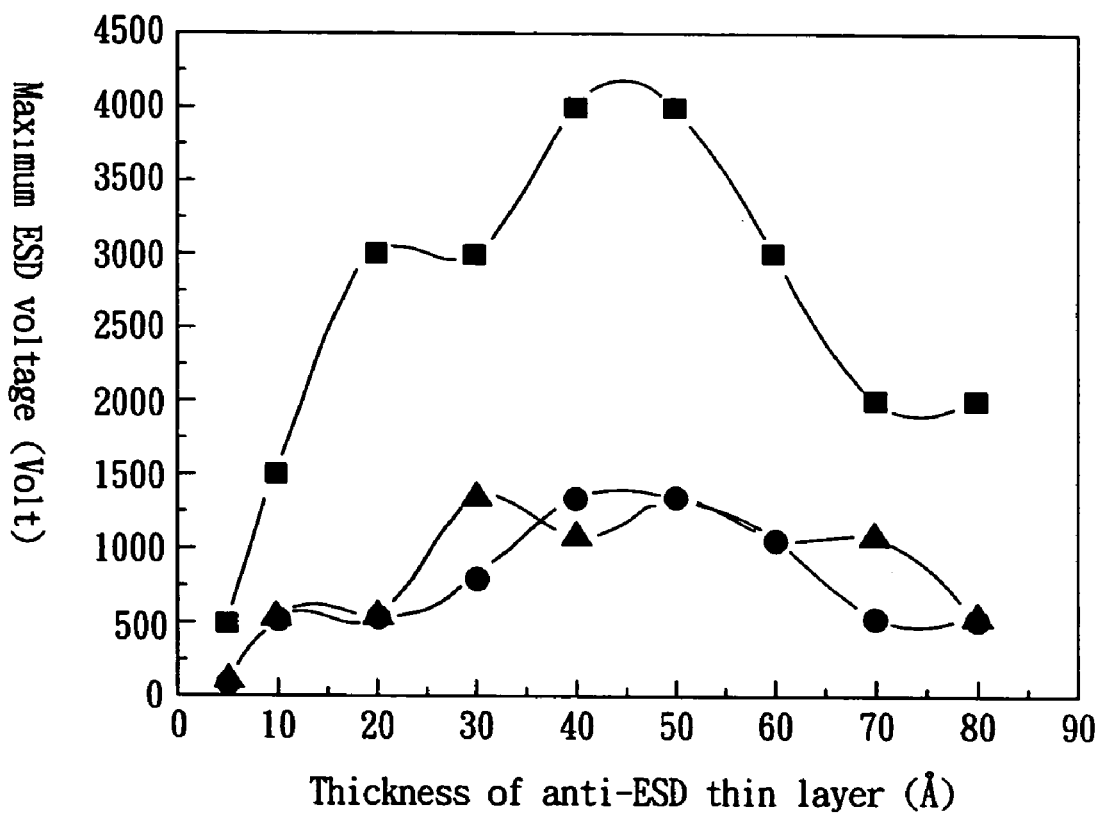
FIGS. 1(a) and 1(b) illustrate the maximum ESD voltage and the reverse withstanding voltage of a GaN-based LED according the present invention versus the thickness of the GaN-based LED's anti-ESD thin layer.
Figure 1B:
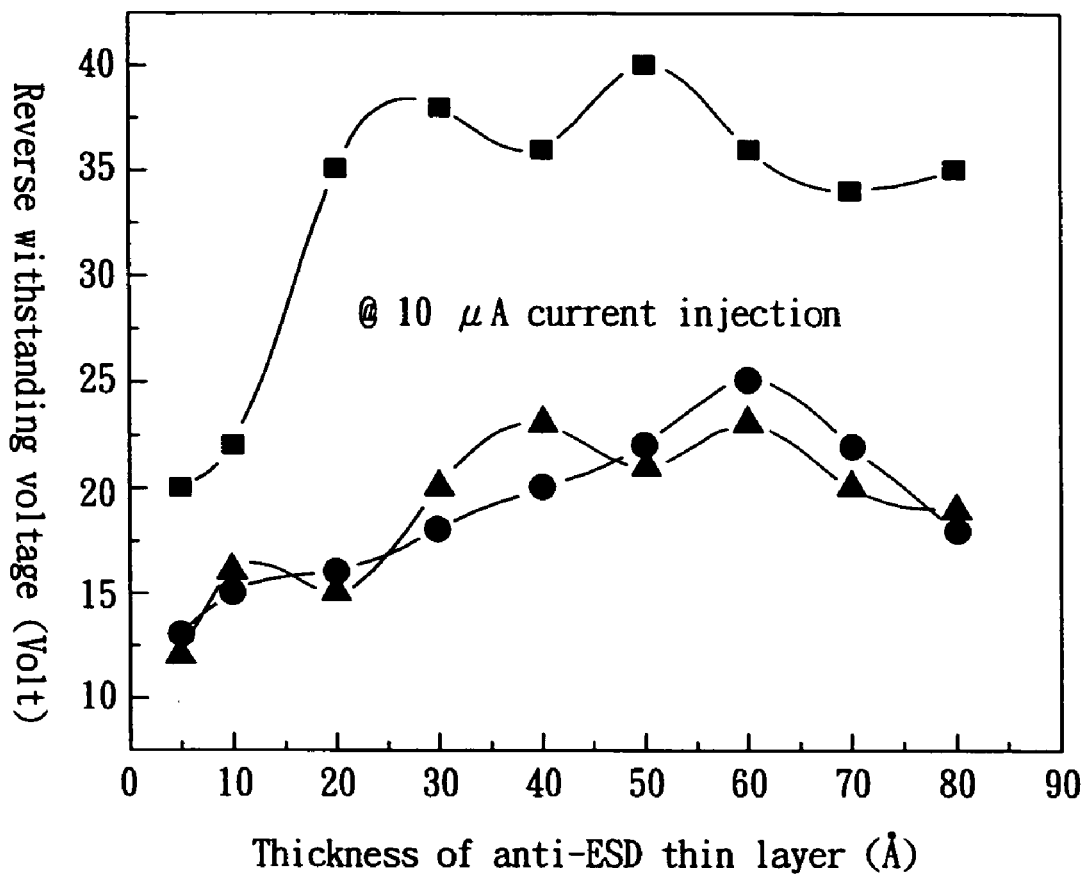
Figure 2:
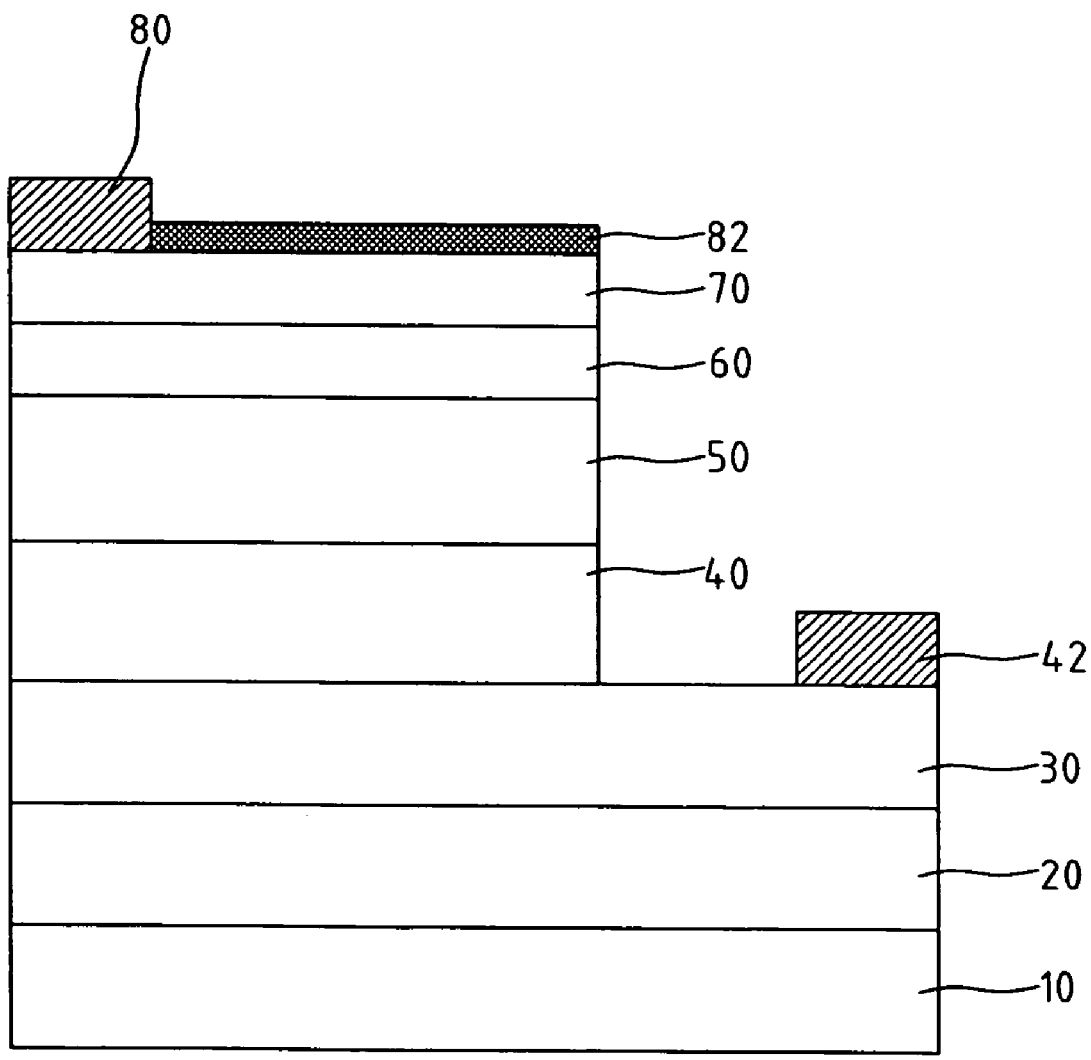
FIG. 2 is a schematic diagram showing the epitaxial structure of the GaN-based LED according to the first embodiment of the present invention.

FIG. 2 is a schematic diagram showing the epitaxial structure of the GaN-based LED according to the first embodiment of the present invention. As shown in FIG. 2, the GaN-based LED has a substrate 10 made of C-plane, R-plane, or A-plane aluminum-oxide monocrystalline (sapphire), or an oxide monocrystalline having a lattice constant compatible with that of nitride semiconductors. The substrate 10 can also be made of SiC (6H—SiC or 4H—SiC), Si, ZnO, GaAs, or $MgAl_2O_4$. Generally, the most common material used for the substrate 10 is sapphire or SiC. A buffer layer 20 made of $Al_aGa_bIn_{1-a-b}N$ ($0 \leq a,b<1$, $a+b \leq 1$) having a specific composition is then formed on an upper side of the substrate 10. On top of the buffer layer 20, an n-type contact layer 30 is formed and made of a GaN-based material. Then, on top of n-type contact layer 30, an active layer 40 made of InGaN covers a part of the n-type contact layer 30's upper surface. A negative electrode 42, on the other hand, is on top of another part of the n-type contact layer 30's upper surface not covered by the active layer 40.

On top of the active layer 40, a p-type cladding layer 50 made of a GaN-based material, a p-type contact layer 60 made of p-type GaN, and an anti-ESD thin layer 70 are sequentially stacked in this order from bottom to top. The anti-ESD thin layer 70 is the key to the present invention. Within this first embodiment of the present invention, the anti-ESD thin layer 70 is made of undoped $In_dGa_{1-d}N$ ($0<d\leq1$) having a specific composition. The anti-ESD thin layer 70 has a thickness between 5 Å and 100 Å and a growing temperature between 600° C. and 1100° C.

Then, on top of the anti-ESD thin layer 70, there are a positive electrode 80 and a transparent conductive layer 82, which are not overlapping with each other. The positive electrode 80 is made of one of the materials including Ni/Au alloy, Ni/Pt alloy, Ni/Pd alloy, Ni/Co alloy, Pd/Au alloy, Pt/Au alloy, Ti/Au alloy, Cr/Au alloy, Sn/Au alloy, Ta/Au alloy, TiN, $TiWN_x$ ($x\geq0$), $WSi_y$ ($y\geq0$), and other similar metallic materials. The transparent conductive layer 82 can be a metallic conductive layer or a transparent oxide layer. The metallic conductive layer is made of one of the materials including Ni/Au alloy, Ni/Pt alloy, Ni/Pd alloy, Pd/Au alloy, Pt/Au alloy, Cr/Au alloy, Ni/Au/Be alloy, Ni/Cr/Au alloy, Ni/Pt/Au alloy, Ni/Pd/Au alloy, and other similar materials. The transparent oxide layer, on the other hand, is made of one of the materials including ITO, CTO, ZnO:Al, $ZnGa_2O_4$, $SnO_2$:Sb, $Ga_2O_3$:Sn, $AgInO_2$:Sn, $In_2O_3$:Zn, $CuAlO_2$, LaCuOS, NiO, $CuGaO_2$, and $SrCu_2O_2$.

Figure 3:
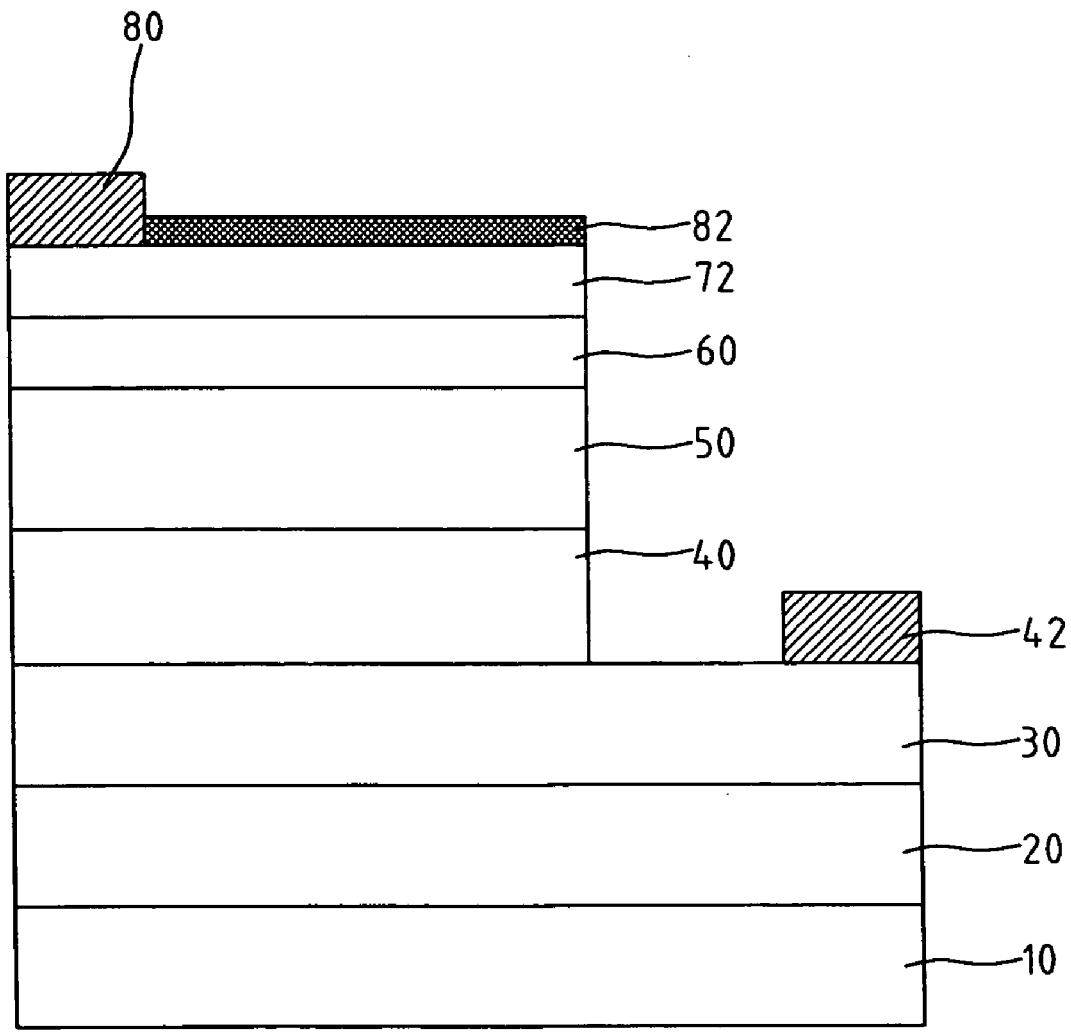
FIG. 3 is a schematic diagram showing the epitaxial structure of the GaN-based LED according to the second embodiment of the present invention.

FIG. 3 is a schematic diagram showing the epitaxial structure of the GaN-based LED according to the second embodiment of the present invention. As shown in FIG. 3, this embodiment of the present invention has an identical structure as in the previous embodiment. The only difference lies in the material used for the anti-ESD thin layer. Within this embodiment, the anti-ESD thin layer 72 is made of undoped, low-band-gap (Eg<3.4 eV) $Al_eIn_fGa_{1-e-f}N$ ($0<e$, $f<1$, $e+f<1$) having a specific composition. The anti-ESD thin layer 72 has a thickness between 5 Å and 100 Å and a growing temperature between 600° C. and 1100° C.

Figure 4:
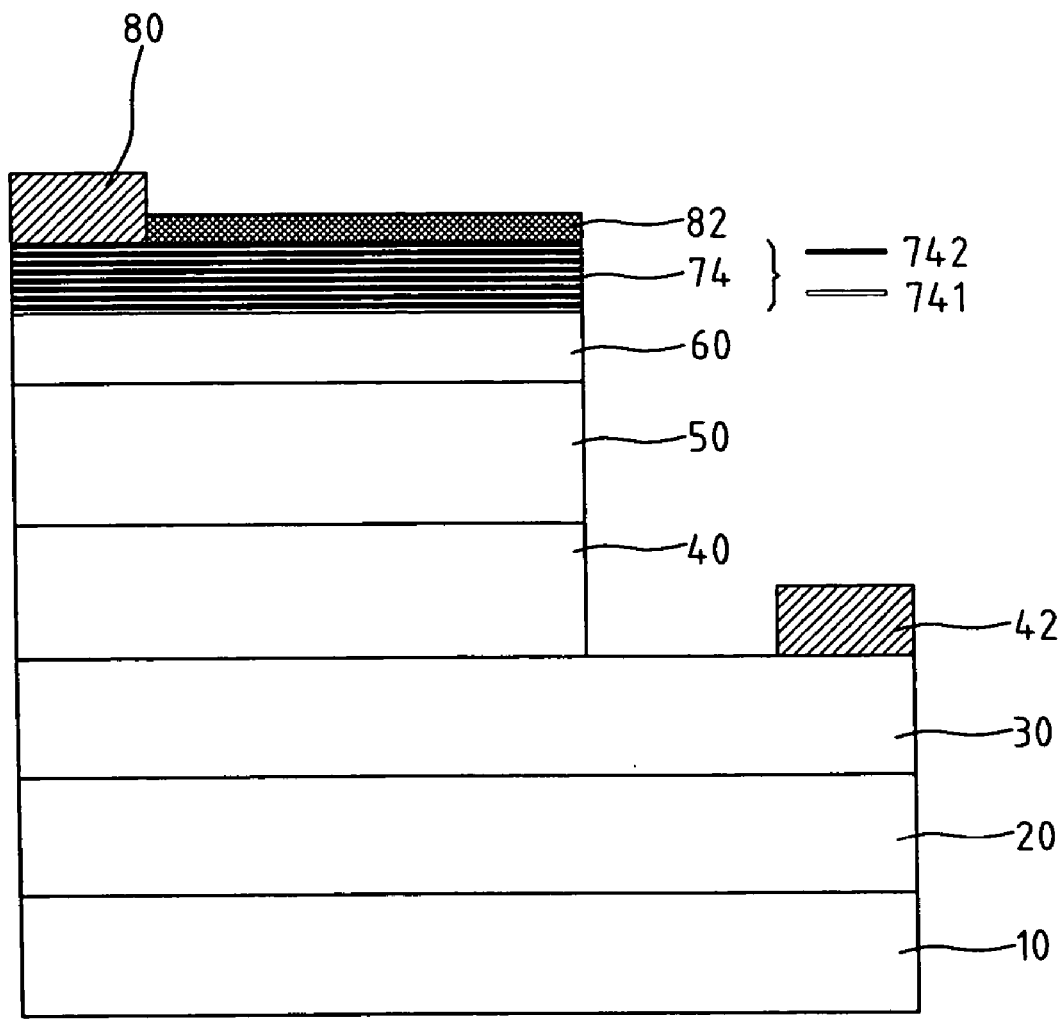
FIG. 4 is a schematic diagram showing the epitaxial structure of the GaN-based LED according to the third embodiment of the present invention.

FIG. 4 is a schematic diagram showing the epitaxial structure of the GaN-based LED according to the third embodiment of the present invention. As shown in FIG. 4, this embodiment of the present invention has an identical structure as in the previous embodiments. The only difference lies in the material used and the structure of the anti-ESD thin layer. Within this embodiment, the anti-ESD thin layer 74 has a superlattice structure formed by alternately stacking an InGaN thin layer 741 and an AlInGaN thin layer 742. Each of the InGaN thin layers 741 is made of undoped $In_gGa_{1-g}N$ ($0<g\leq1$) having a specific composition, and has a thickness between 5 Å and 20 Å, and a growing temperature between 600° C. and 1100° C. In addition, the $In_gGa_{1-g}N$ composition (i.e. the parameter g of the foregoing molecular formula) of each InGaN thin layer 741 is not required to be identical. On the other hand, each of the AlInGaN thin layers 742 is made of undoped, low-band-gap (Eg<3.4 eV) $Al_hIn_iGa_{1-h-i}N$ ($0<h,i<1$, $h+i<1$) having a specific composition, and has a thickness between 5 Å and 20 Å, and a growing temperature between 600° C. and 1100° C. Similarly, the $Al_hIn_iGa_{1-h-i}N$ composition (i.e. the parameters h and i of the foregoing molecular formula) of each AlInGaN thin layer 742 is not required to be identical.

Within the anti-ESD thin layer 74's superlattice structure, a InGaN thin layer 741 is at the bottom and, on top of the bottommost InGaN thin layer 741, a AlInGaN thin layer 742, another InGaN thin layer 741, etc., are stacked upon each other in this repetitive fashion. In another variation of this embodiment, it is an AlInGaN thin layer 742 that is at the bottom. Then, on top of the bottommost AlInGaN thin layer 742, an InGaN thin layer 741, another AlInGaN thin layer 742, etc., are stacked upon each other in this repetitive fashion. In other words, the InGaN thin layer 741 and the AlInGaN thin layer 742 are repetitively and alternately stacked. The repetition count is at least two (i.e. there are at least two layers of the InGaN thin layer 741 and at least two layers of the AlInGaN thin layer). The total thickness of the anti-ESD thin layer 74 is at most 200 Å.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A GaN-based LED structure, comprising:

a substrate made of a material selected from the group consisting of sapphire, 6H—SiC, 4H—SiC, Si, ZnO, GaAs, $MgAl_2O_4$, and an oxide monocrystalline having a lattice constant compatible with that of nitride semiconductors;

a buffer layer made of $Al_aGa_bIn_{1-a-b}N$ ($0\leq a,b<1$, $a+b\leq1$) having a specific composition located on top of an upper side of said substrate;

an n-type contact layer made of a GaN-based material located on top of said buffer layer;

an active layer made of InGaN located on top of a part of said n-type contact layer's upper surface;

a negative electrode located on top of another part of said n-type contact layer's upper surface not covered by said active layer;

a p-type cladding layer made of a p-type GaN-based material located on top of said active layer;

a p-type contact layer made of p-type GaN located on top of said p-type cladding layer;

an anti-ESD thin layer made of a material selected from the group consisting of undoped InGaN, undoped AlInGaN having a band gap less than 3.4 eV, and a superlattice structure comprising undoped InGaN and undoped AlInGaN having a band gap less than 3.4 eV;

a transparent conductive layer selected from the group consisting of a metallic conductive layer and a transparent oxide layer, located on top of a part of said anti-ESD thin layer's upper surface, wherein said metallic conductive layer is made of a material selected from the group consisting of Ni/Au alloy, Ni/Pt alloy, Ni/Pd alloy, Pd/Au alloy, Pt/Au alloy, Cr/Au alloy, Ni/Au/Be alloy, Ni/Cr/Au alloy, Ni/Pt/Au alloy, and Ni/Pd/Au alloy, and said transparent oxide layer is made of a material selected from the group consisting of ITO, CTO, ZnO:Al, $ZnGa_2O_4$, $SnO_2$:Sb, $Ga_2O_3$:Sn, $AgInO_2$:Sn, $In_2O_3$:Zn, $CuAlO_2$, LaCuOS, NiO, $CuGaO_2$, and $SrCu_2O_2$; and a positive electrode located on top of another part of said anti-ESD thin layer's upper surface not covered by said transparent conductive layer, made of a material selected from the group consisting of Ni/Au alloy, Ni/Pt alloy, Ni/Pd alloy, Ni/Co alloy, Pd/Au alloy, Pt/Au alloy, Ti/Au alloy, Cr/Au alloy, Sn/Au alloy, Ta/Au alloy, TiN, $TiWN_x$ ($x\geq0$), and $WSi_y$ ($y\geq0$).

2. The GaN-based LED structure as claimed in claim 1, wherein said anti-ESD thin layer has a thickness between 5

Å and 100 Å, and is made of undoped $In_dGa_{1-d}N$ ($0<d\leq1$) having a specific composition.

3. The GaN-based LED structure as claimed in claim 1, wherein said anti-ESD thin layer has a thickness between 5 Å and 100 Å, and is made of undoped $Al_eIn_fGa_{1-e-f}N$ ($0<e,f<1$, $e+f<1$) having a specific composition and a band gap less than 3.4 eV.

4. The GaN-based LED structure as claimed in claim 1, wherein said anti-ESD layer has a thickness no more than 200 Å and has a superlattice structure formed by alternately stacking a InGaN thin layer and a AlInGaN thin layer repetitively with a repetition count at least two, wherein each of said InGaN thin layers has a thickness between 5 Å and 20 Å, and is made of undoped $In_kGa_{1-k}N$ ($0<k\leq1$) having a specific composition, and each of said AlInGaN thin layers has a thickness between 5 Å and 20 Å, and is made of undoped $Al_pIn_qGa_{1-p-q}N$ ($0<p,q<1$, $p+q<1$) having a specific composition and a band gap less than 3.4 eV.

* * * * *